(12) United States Patent
Yoon et al.

(10) Patent No.: US 7,727,423 B2
(45) Date of Patent: Jun. 1, 2010

(54) ANISOTROPIC CONDUCTIVE FILM COMPOSITION AND FILM INCLUDING THE SAME

(75) Inventors: Kang Bae Yoon, Seoul (KR); Kyoung Soo Park, Anyang-si (KR); Cheon Seok Lee, Seongnam-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 119 days.

(21) Appl. No.: 12/003,782

(22) Filed: Dec. 31, 2007

(65) Prior Publication Data

US 2008/0185559 A1    Aug. 7, 2008

(30) Foreign Application Priority Data

Dec. 29, 2006  (KR)  .................... 10-2006-0138670
Oct. 30, 2007  (KR)  .................... 10-2007-0109690

(51) Int. Cl.
*H01B 1/00*    (2006.01)
*H01B 1/04*    (2006.01)
*H01B 1/02*    (2006.01)

(52) U.S. Cl. .................... 252/500; 252/502; 252/512

(58) Field of Classification Search ................ 252/500, 252/502, 512
See application file for complete search history.

(56) References Cited

U.S. PATENT DOCUMENTS

| | | | | | |
|---|---|---|---|---|---|
| 4,775,500 | A | * | 10/1988 | Funakoshi et al. | .......... 264/461 |
| 5,330,684 | A | * | 7/1994 | Emori et al. | ................ 252/512 |
| 5,932,339 | A | * | 8/1999 | Sakurai et al. | ............. 428/323 |
| 6,121,358 | A | * | 9/2000 | Dershem et al. | ........... 524/439 |
| 6,194,492 | B1 | * | 2/2001 | Sakurai et al. | ............. 523/515 |
| 6,214,460 | B1 | * | 4/2001 | Bluem et al. | .......... 428/355 AC |
| 6,527,984 | B1 | * | 3/2003 | Ishimatsu | ................... 252/500 |
| 6,793,850 | B2 | * | 9/2004 | Ichikawa et al. | ............ 252/511 |
| 7,241,644 | B2 | * | 7/2007 | Arifuku et al. | ............. 438/119 |
| 7,452,923 | B2 | * | 11/2008 | Jeon et al. | ...................... 522/90 |
| 2006/0054277 | A1 | * | 3/2006 | Byun et al. | ................. 156/327 |

\* cited by examiner

*Primary Examiner*—Mark Kopec
*Assistant Examiner*—Jaison P Thomas
(74) *Attorney, Agent, or Firm*—Lee & Morse, P.C.

(57) ABSTRACT

An anisotropic conductive film (ACF) composition includes a thermoplastic resin having a weight average molecular weight of about 150,000 to about 600,000, a thermosetting curing agent having a weight average molecular weight of about 100 to about 10,000, the thermosetting curing agent including an acrylate functional group or a methacrylate functional group, an organic peroxide, a silane coupling agent, and conductive particles.

20 Claims, 1 Drawing Sheet

$$CH_2=CH-\overset{O}{\overset{\|}{C}}-O-CH_2-\overset{OH}{\overset{|}{CH}}-CH_2-O-\overset{CH_3}{\overset{|}{CH}}-CH_2-O-\underset{}{\bigcirc}-\overset{CH_3}{\underset{CH_3}{\overset{|}{C}}}-\underset{}{\bigcirc}-O-CH_2-\overset{CH_3}{\overset{|}{CH}}-O-CH_2-\overset{OH}{\overset{|}{CH}}-CH_2-O-\overset{O}{\overset{\|}{C}}-CH=CH_2$$

Formula 1

Formula 1

ANISOTROPIC CONDUCTIVE FILM COMPOSITION AND FILM INCLUDING THE SAME

BACKGROUND OF THE INVENTION

1. Field of the Invention

Embodiments of the present invention relate to an anisotropic conductive film composition and a film including the same. More particularly, embodiments of the present invention relate to an anisotropic conductive film composition including a thermoplastic resin and a thermosetting curing agent, and exhibiting superior quality, productivity, and operability.

2. Description of the Related Art

In general, an anisotropic conductive film (ACF) refers to a film-type adhesive having conductive particles dispersed in an insulating adhesive binder. As such, when the ACF is positioned between electrical components, the conductive particles may establish an electrical connection therebetween, and the insulating adhesive binder may flow away from the electrical components to provide an insulating coating around the resultant electrical connection. The ACF may be used in, e.g., liquid crystal displays (LCDs), chip-on-films (COFs), tape carrier packages (TCPs), printed circuit boards (PCBs), and so forth.

Conventional ACFs may include a binder, e.g., an epoxy-based binder or a phenol-based binder, mixed with a curing agent and conductive particles. However, the conventional binders may exhibit insufficient adhesive properties and a relatively low glass transition temperature, thereby imparting poor mechanical connection and adhesion reliability to the conventional ACF. Further, the conventional binders may fail to provide good quality and productivity when produced in large quantity. For example, the conventional binder may require high curing temperature and long curing time, thereby imparting low long-term reliability to the ACF. In another example, the conventional binder may have different flow properties with respect to the curing agent due to different rheology characteristic thereof, thereby causing either excessive generation of foam upon low curing rate or low conductivity upon high curing rate, which in turn, may result in either low reliability or low conductivity, respectively. Attempts have been made to use a thermoplastic-based binder. However, the conventional thermoplastic-based binder may exhibit low compatibility with curing agents, and reduced film strength and strain. Further, contraction/expansion of the thermoplastic-based binder may be difficult to control, thereby inhibiting curing at low temperatures and reducing reliability under hot and humid conditions.

SUMMARY OF THE INVENTION

Embodiments of the present invention are therefore directed to an anisotropic conductive film (ACF) composition, which substantially overcomes one or more of the disadvantages of the related art.

It is therefore a feature of an embodiment of the present invention to provide an ACF composition including a thermoplastic resin and a thermosetting curing agent, and exhibiting improved adhesion and strength.

It is another feature of an embodiment of the present invention to provide an ACF composition including a thermoplastic resin and a thermosetting curing agent, and exhibiting superior reliability and productivity.

It is yet another feature of an embodiment of the present invention to provide an ACF including an ACF composition with one or more of the above features.

At least one of the above and other features and advantages of the present invention may be realized by providing an anisotropic conductive film (ACF) composition, including a thermoplastic resin having a weight average molecular weight of about 150,000 to about 600,000, a thermosetting curing agent having a weight average molecular weight of about 100 to about 10,000, the thermosetting curing agent including an acrylate functional group and/or a methacrylate functional group, an organic peroxide, a silane coupling agent, and conductive particles.

The thermosetting curing agent may be present in the ACF composition in an amount of about 100 parts by weight to about 400 parts by weight with respect to 100 parts by weight of the thermoplastic resin. The organic peroxide may be present in the ACF composition in an amount of about 0.3 parts by weight to about 10 parts by weight with respect to 100 parts by weight of the thermosetting curing agent. The silane coupling agent may be present in the ACF composition in an amount of about 0.2 parts by weight to about 10 parts by weight with respect to 100 parts by weight of a combined amount of the thermoplastic resin, the thermosetting curing agent, and the organic peroxide, and the conductive particles may be present in the ACF composition in an amount of about 0.2 parts by weight to about 30 parts by weight with respect to 100 parts by weight of a combined amount of the thermoplastic resin, the thermosetting curing agent, the organic peroxide, and the silane coupling agent.

The thermoplastic resin may include one or more of an olefin resin, an acryl rubber, a butadiene resin, an acrylonitrile butadiene copolymer, a carboxylated acrylonitrile butadiene copolymer, a polyvinyl butyral resin, a phenoxy resin and/or an epoxy resin. The thermosetting curing agent may include one or more of methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(arcyloxypolymethoxy)phenyl]propane, 2,2-bis[4-(arcyloxypolyethoxy)phenyl]propane, dicyclopentenylacrylate, tricyclodecanylacrylate, tris(acryloyloxyethyl) isocyanorate, 2-methacryloyloxyethyl acid phosphate, and/or 2-acryloyloxyethyl phosphate. The organic peroxide may include one or more of a diacyl peroxide, a peroxydicarbonate, a peroxyester, a peroxyketal, and/or a dialkyl peroxide. The silane coupling agent may include one or more of a vinyl group, an epoxy group, a methacryloxy group, an arcyloxy group, an amino group, a ureido group, a chloropropyl group, a mercapto group, a sulfido group, and/or an isocyanate group. The conductive particles may include metal particles, crystalline carbon particles, amorphous carbon particles, metal coated polymeric particles, and/or insulation-coated conductive particles. The ACF composition may further include one or more of a polymerization inhibitor, an antioxidant, and/or a heat stabilizer.

At least one of the above and other features and advantages of the present invention may be realized by providing an anisotropic conductive film (ACF), including a release layer, and a film composition on the release layer, the composition including a thermoplastic resin having a weight average molecular weight of about 150,000 to about 600,000, a thermosetting curing agent having a weight average molecular weight of about 100 to about 10,000, the thermosetting curing agent including an acrylate functional group or a methacrylate functional group, an organic peroxide, a silane coupling agent, and conductive particles. The ACF may exhibit a yield stress of about 20 gf/mm$^2$ or more and a breaking strain of about 300% or more.

The thermosetting curing agent may be present in the film composition of the ACF in an amount of about 100 parts by weight to about 400 parts by weight with respect to 100 parts by weight of the thermoplastic resin. The organic peroxide may be present in the film composition of the ACF in an amount of about 0.3 parts by weight to about 10 parts by weight with respect to 100 parts by weight of the thermosetting curing agent. The silane coupling agent may be present in the film composition of the ACF in an amount of about 0.2 parts by weight to about 10 parts by weight with respect to 100 parts by weight of a combined amount of the thermoplastic resin, the thermosetting curing agent, and the organic peroxide, and the conductive particles may be present in the film composition of the ACF in an amount of about 0.2 parts by weight to about 30 parts by weight with respect to 100 parts by weight of a combined amount of the thermoplastic resin, the thermosetting curing agent, the organic peroxide, and the silane coupling agent.

The thermoplastic resin may include one or more of an olefin resin, an acryl rubber, a butadiene resin, an acrylonitrile butadiene copolymer, a carboxylated acrylonitrile butadiene copolymer, a polyvinyl butyral resin, a phenoxy resin and/or an epoxy resin. The thermosetting curing agent may include one or more of methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(arcyloxypolymethoxy)phenyl]propane, 2,2-bis[4-(arcyloxypolyethoxy)phenyl]propane, dicyclopentenylacrylate, tricyclodecanylacrylate, tris(acryloyloxyethyl) isocyanorate, 2-methacryloyloxyethyl acid phosphate, and/or 2-acryloyloxyethyl phosphate. The organic peroxide may include one or more of a diacyl peroxide, a peroxydicarbonate, a peroxyester, a peroxyketal, and/or a dialkyl peroxide. The silane coupling agent may include one or more of a vinyl group, an epoxy group, a methacryloxy group, an arcyloxy group, an amino group, a ureido group, a chloropropyl group, a mercapto group, a sulfido group, and/or an isocyanate group. The ACF may further include one or more of a polymerization inhibitor, an antioxidant, and/or a heat stabilizer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
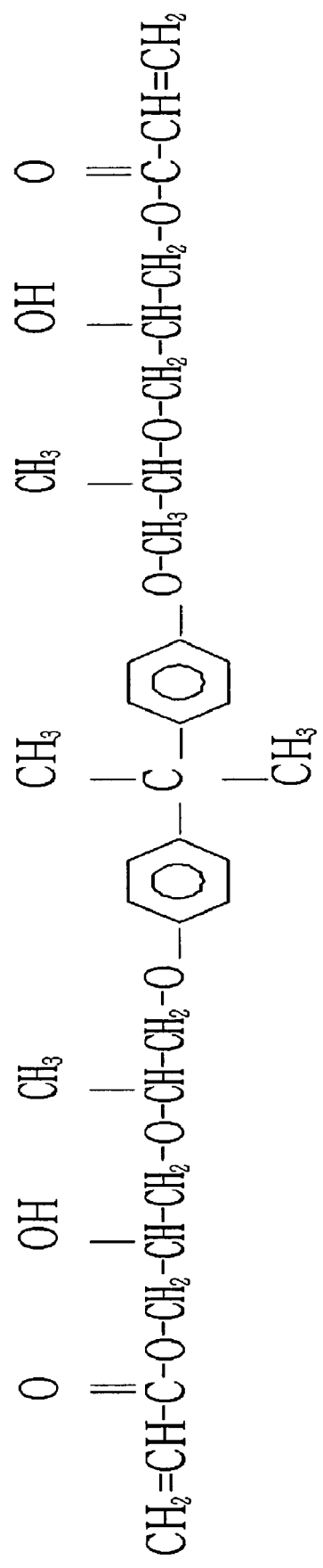
FIG. 1 illustrates a structure of an acrylate resin used in an anisotropic conductive film composition according to embodiments of the present invention.

Korean Patent Application No. 10-2006-0138670, filed on Dec. 29, 2006, and Korean Patent Application No. 10-2007-0109690, filed on Oct. 30, 2007, in the Korean Intellectual Property Office, both entitled: "Semi Thermosetting Anisotropic Conductive Film Composition," are incorporated by reference herein in their entirety.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items. For example, the term "a curing agent" may represent a single compound, e.g., a bisphenol A type epoxy acrylate, or multiple compounds in combination, e.g., a bisphenol A type epoxy acrylate mixed with 2-acryloyloxyethyl phosphate. Further, as used herein, molecular weights of polymeric materials are weight average molecular weights, unless otherwise indicated.

Exemplary embodiments of the present invention will now be described more fully hereinafter. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

An anisotropic conductive film (ACF) composition according to an embodiment of the present invention may include a thermoplastic binder, a thermosetting curing agent, an organic peroxide, a silane coupling agent, and conductive particles. The ACF composition may be semi-thermosetting. In this respect it is noted that "semi-thermosetting" refers to a composition having both a curing part, i.e., imparts connection stability to provide mechanical, chemical, e.g., water vapor, and/or thermal effects, and a thermoplastic part, i.e., provides reworkability. It is further noted that "reworkability" refers to an ability to detach a cured ACF and reuse the circuit component when needed, e.g., due to faulty connection, misalignment, and so forth.

The thermoplastic binder of the ACF may provide a matrix for film formation. The thermoplastic binder may include any suitable thermoplastic resin having a relatively high weight average molecular weight, i.e., weight average molecular weight of about 150,000 to about 600,000. Examples of thermoplastic resins may include one or more of an olefin resin, an acryl rubber, a butadiene resin, an acrylonitrile butadiene copolymer, a carboxylated acrylonitrile butadiene copolymer, a polyvinyl butyral resin, a phenoxy resin, and/or an epoxy resin. It should be noted that use of, e.g., a chloroprene rubber, as the thermoplastic resin may trigger generation of free chloride ions, thereby causing potential corrosion of, e.g., circuit elements.

Use of a thermoplastic resin having a relatively high weight average molecular weight may be advantageous in imparting good compatibility to components of the ACF composition, preventing precipitation of the conductive particles out of the ACF composition, and providing sufficient yield stress and breaking strain to the ACF. Accordingly, use of such a thermoplastic resin may facilitate formation of an ACF with superior reworkability properties, e.g., reworkability of the ACF due to poor pre-bonding of a circuit connection. In addition, the thermoplastic resin may impart good bonding properties to the ACF, thereby providing superior adhesion between the ACF and, e.g., corresponding circuit elements.

When the thermoplastic resin has a weight average molecular weight below about 150,000, the conductive particles may precipitate out of the ACF composition, and the thermoplastic binder may have reduced strength and strain, thereby providing unstable and brittle film. When the thermoplastic resin has a weight average molecular weight above about 600,000, phase separation may occur during preparation of the ACF composition due to reduced compatibility, thereby reducing adhesion and long-term contact reliability, e.g., due to excessive contraction and expansion.

The thermosetting curing agent of the ACF may include a thermosetting material having a weight average molecular weight of about 100 to about 10,000 and including an acrylate and/or methacrylate functional group in order to provide sufficient density. The thermosetting material may facilitate a faster curing reaction, i.e., perform connection in a relatively short time, thereby providing adhesion between circuit elements, contact reliability, and good module productivity of the ACF.

A weight average molecular weight of a thermosetting material below about 100 may cause high reactivity. A weight average molecular weight of a thermosetting material above about 10,000 may form an insufficiently dense ACF composition during heating and pressing, thereby reducing long-term contact and adhesion reliability.

The thermosetting material may include one or more of a polymer, an oligomer, and/or a monomer having an acrylate or a methacrylate functional group. For example, the thermosetting material may include one or more of methyl acrylate; ethyl acrylate; isopropyl acrylate; isobutyl acrylate; ethylene glycol diacrylate; diethylene glycol diacrylate; trimethylolpropane-triacrylate; tetramethylolmethane-tetraacrylate; 2-hydroxy-1,3-diacryloxypropane; tricyclodecanylacrylate; 2,2-bis[4-(arcyloxypolymethoxy)phenyl]propane; 2,2-bis[4-(arcyloxypolyethoxy) phenyl]propane; dicyclopentenylacrylate; tris(acryloyloxyethyl) isocyanorate; and/or (meth)acrylate having a phosphate ester structure, e.g., 2-methacryloyloxyethyl acid phosphate or 2-acryloyloxyethyl phosphate. Use of a (meth)acrylate having a phosphate ester structure may improve adhesion and room temperature stability of the ACF.

The thermosetting curing agent may be present in the ACF composition in an amount of about 100 parts by weight to about 400 parts by weight with respect to 100 parts by weight of the thermoplastic binder. In other words, a weight ratio of the thermoplastic binder to the thermosetting curing agent may be about 1:4 to about 1:1. When the amount of the thermosetting curing agent is above about 400 parts by weight with respect to 100 parts by weight of the thermoplastic binder, reworkability of the ACF composition may be decreased after heating and pressing. When the amount of the thermosetting curing agent is below about 100 parts by weight with respect to 100 parts by weight of the thermoplastic binder, curing density may decrease, thereby reducing contact reliability.

The organic peroxide of the ACF composition may function as a heat curing initiator. Any suitable organic peroxide may be used. Examples of organic peroxides may include one or more of a diacyl peroxide, a peroxydicarbonate, a peroxyester, a peroxyketal, and/or a dialkyl peroxide. More specific examples of the organic peroxide may include isobutyryl peroxide; 3,5,5-trimethylhexanoyl peroxide; lauroyl peroxide; stearoyl peroxide; succinyl peroxide; m-toluoyl/benzoyl peroxide; benzoyl peroxide; di-n-propyl peroxydicarbonate; diisopropyl peroxydicarbonate; bis(4-t-butylcyclohexyl)peroxydicarbonate; di-2-ethoxyethyl peroxydicarbonate; di-2-ethylhexyl peroxydicarbonate; dimethoxybutyl peroxydicarbonate; bis(3-methyl-3-methoxybutyl)peroxydicarbonate; t-butyl peroxypyvalate; t-butylperoxy-2-ethyl hexanoate; t-butyl peroxyisobutyrate; t-butyl peroxylaurate; t-butyl peroxyisopropyl monocarbonate; t-butylperoxy 2-ethylhexyl monocarbonate; t-butyl peroxyacetate; t-butyl peroxybenzoate; α,α'-bis(neodecanoylperoxy)diisopropylbenzene; cumyl peroxyneodecanoate; 1,1,3,3-tetramethylbutyl peroxyneodecanoate; 1-cyclohexyl-1-methylethyl peroxynoedecanoate; t-hexyl peroxyneodecanoate; t-hexyl peroxypyvalate; 1,1,3,3-tetramethylbutylperoxy 2-ethylhexanoate; dicumyl peroxide; 2,5-dimethyl-2,5-bis(2-ethylhexanoylperoxy)hexane; 1-cyclohexyl-1-methylethyl peroxy-2-ethyl hexanoate; t-hexylperoxy-2-ethyl hexanoate; t-hexylperoxyisopropyl monocarbonate; t-butylperoxy-3,5,5-trimethyl hexanoate; t-hexylperoxy benzoate; 2,5-dimethyl-2,5-bis(m-toluoylperoxy)hexane; 1,1-bis(t-hexylperoxy)cyclohexane; 2,5-dimethyl-2,5-bis(benzoylperoxy)hexane; 1,1-bis(t-butylperoxy)cyclohexane; 1,1-bis(t-hexylperoxy)-3,3,5-trimethylcyclohexane; di-t-butyl peroxide; 1,1-bis(t-butylperoxy)-3,3,5-trimethylcyclohexane; t-butylcumyl peroxide; n-butyl-4,4-bis(t-butylperoxy)valarate; α,α'-bis(t-butylperoxy)diisopropylbenzene; 2,5-dimethyl-2,5-bis(t-butylperoxy)hexyne-3; and so forth.

An amount of the organic peroxide in the ACF composition may be determined with respect to proper balance of curing and integrity of the ACF composition. For example, the organic peroxide may be present in the ACF composition in an amount of about 0.3 parts by weight to about 10 parts by weight, with respect to 100 parts by weight of the thermosetting curing agent. When the amount of the organic peroxide is below about 0.3 parts by weight, curing rate at low temperatures may be reduced. When the amount of the organic peroxide is about above about 10 parts by weight, room temperature stability and integrity of the ACF may deteriorate and the ACF composition may be difficult to completely remove during rework due to excessive curing.

The silane coupling agent of the ACF composition may improve reactivity between components of the ACF composition, e.g., between different resins, and may enhance adhesion between the ACF composition and inorganic materials, e.g., copper, glass, and so forth, thereby improving heat and moisture resistance and enhancing contact reliability of the ACF. The silane coupling agent may be any suitable silane coupling agent having one or more functional groups, e.g., a vinyl group, an epoxy group, a methacryloxy group, an arcyloxy group, an amino group, a ureido group, a chloropropyl group, a mercapto group, a sulfido group, and/or an isocyanate group.

An amount of the silane coupling agent may be about 0.2 parts by weight to about 10 parts by weight, with respect to 100 parts by weight of a combined amount of the thermoplastic binder, thermosetting curing agent, and organic peroxide. An amount below about 0.2 parts by weight of the silane coupling agent may be insufficient to improve reactivity and coupling of the components of the ACF composition. An amount above about 10 parts by weight of the silane coupling agent may decrease cohesiveness of the components of the ACF composition, thereby reducing adhesion and/or reliability thereof.

The conductive particles of the ACF composition may impart conductivity to the ACF composition. Example of conductive particles may include metal particles, e.g., one or more of gold (Au), silver (Ag), nickel (Ni), copper (Cu), tin (Sn), and/or solder, carbon particles, resin-based particles, e.g., one or more of benzoguanine, poly-methylmethacrylate (PMMA), acryl copolymer, polystyrene, and so froth, metal-coated particles, insulation-coated conductive particles, and so forth. A diameter size of the conductive particles may be determined with respect to a pitch of a corresponding circuit and/or pattern. For example, the conductive particles may have a diameter size of about 1 μm to about 30 μm, and a combination of conductive particles having different sizes may be used. The conductive particles may be present in the ACF composition in an amount of about 0.2 parts by weight to about 30 parts by weight, with respect to 100 parts by weight of a combined amount of the thermoplastic binder, thermosetting curing agent, organic peroxide, and silane coupling agent. When the amount of the conductive particles is below about 0.2 parts by weight, the conductivity of the ACF composition may be too low. When the amount of the conductive particles is above about 30 parts by weight, the amount of, e.g., the thermoplastic binder, may be reduced, thereby decreasing insulation between, e.g., electrical components.

The ACF composition may further include an additive in order to impart additional properties to the ACF composition. Any suitable additives may be used that do not impair the basic ACF composition properties. Examples of additives may include one or more of a polymerization inhibitor, an antioxidant, a heat stabilizer, and so froth. The polymerization inhibitor may be any suitable polymerization inhibitor, e.g., one or more of hydroquinone, hydroquinone monomethyl ether, p-benzoquinone, and/or phenothiazine. The antioxidant, e.g., one or more of tetrakis-(methylene-(3,5-di-t-butyl-4-hydrocinnamate)methane, 3,5-bis(1,1-dimethylethyl)-4-hydroxybenzene propanoic acid thiol di-2,1-ethanediyl ester, octadecyl 3,5-di-t-butyl-4-hydroxy hydrocinnamate (commercially available from Ciba, Switzerland), and/or 2,6-di-t-p-methylphenol, may minimize oxidation of the ACF composition caused by heat, and may provide heat stability.

A total amount of additives present in the ACF composition may be about 0.03 parts by weight to about 0.3 parts by weight, with respect to the 100 parts by weight of a combined amount of the thermosetting curing agent and organic peroxide. When the amount of additives is below about 0.03 parts by weight, the desired additive properties may not be attained. When the amount of additives is above about 0.3 parts by weight, amounts of the main components of the ACF composition may be reduced, thereby impairing the basic properties of the ACF composition.

An exemplary method of forming the ACF composition may include dissolving the thermoplastic binder, thermosetting curing agent, organic peroxide, silane coupling agent, and conductive particles in an organic solvent, e.g., one or more of toluene, xylene, propylene glycol monomethyl ether acetate, benzene, acetone, methyl ethyl ketone, tetrahydrofuran, dimethylformaldehyde, cyclohexanone, and so forth, to form a first liquid solution. The first liquid solution may be stirred at a predetermined rate for a predetermined time to form a second liquid solution. The second liquid solution may be coated on a release film to a thickness of, e.g., about 10 µm to about 50 µm, and may be dried for a predetermined period of time to evaporate the organic solvent to form a single layered ACF. The above process may be repeated a multiple number of times to form a multi-layered ACF, e.g., a laminated film having a double-layered structure.

An ACF may require a well-mixed ACF composition to provide uniformity, i.e., the conductive particles may be well dispersed to minimize aggregation, thereby enhancing insulation along a plane of the ACF and improving conduction along a plane perpendicular to the plane of the ACF. Further, uniform ACF composition may minimize particle precipitation, thereby providing facilitating uniform coating, i.e., coating for a long duration over a span of 300 m or more, while having a substantially reduced number of pinholes and/or scratched therein.

An ACF formed of an ACF composition according to embodiments of the present invention may exhibit a yield stress of about 20 gf/mm$^2$ or more, and may exhibit a breaking strain of about 300% or more. Accordingly, the ACF may exhibit improved mechanical properties, e.g., cutting property, reworkability in case of poor pre-bonding, yield stress, breaking strain, and so forth. Such an ACF may improve the module manufacturing line without requiring new equipment or facilities.

EXAMPLES

Example 1

80 g of a carboxylated acrylonitrile butadiene (CAB) copolymer (1072CGX, Zeon Chemicals, Japan, weight average molecular weight of 204,400) was dissolved in a toluene/methyl ethyl ketone mixture having a weight ratio of 2:1 to form a first solution with a solid content of 24%.

Then, 75 g of a bisphenol A type epoxy acrylate resin (VR60, Showa Highpolymer Co., Ltd., Japan, weight average molecular weight of 7,500) was dissolved in methyl ethyl ketone to form a second solution with a solid content of 60%. The first and second solutions were mixed, and 45 g of an acrylate resin having a weight average molecular weight of 2,500 was added. The acrylate resin is represented by Formula 1 in FIG. 1.

Next, 13 g of pentaerythritol triacrylate having an average molecular weight of 298 and three acrylate functional groups, 4 g of 2-acryloyloxyethyl phosphate having an average molecular weight of 196, and 4 g of benzoyl peroxide were dissolved in toluene to a solid content of 10%, and were added to the mixture of the first and second solutions. 1.7 g of a silane coupling agent having a methacryloxy group, i.e., 3-glycidoxypropyltriethoxysilane, and 19 g of nickel (Ni) particles were added to finalize an ACF composition.

Example 2

An ACF composition was prepared according to the method of Example 1, with the exception of using 80 g of a CAB (N34, Zeon Chemicals, Japan, weight average molecular weight of 236,400) dissolved in a toluene/methyl ethyl ketone (mixed at a weigh ratio of 2:1) to a solid content of 25%, instead of using the CAB copolymer (1072CGX, Zeon Chemicals, Japan, weight average molecular weight of 204,400) of Example 1.

Example 3

An ACF composition was prepared according to the method of Example 1, with the exception of using 80 g of an acryl rubber (SG-80H, Nagase Chemtex, Japan, weight average molecular weight of 350,000) dissolved in methyl ethyl ketone to a solid content of 26% instead of the CAB copolymer of Example 1.

Example 4

An ACF composition was prepared according to the method of Example 1, with the exception of using 80 g of an acryl rubber (WS-023, Nagase Chemtex, Japan, weight average molecular weight of 500,000) dissolved in a toluene/ethyl acetate mixture solvent to a solid content of 20% instead of the CAB copolymer of Example 1.

Comparative Example 1

An ACF composition was prepared according to the method of Example 1, with the exception of omitting the 80 g of CAB copolymer, and mixing the 75 g of a bisphenol A type epoxy acrylate resin (VR60, Showa Highpolymer Co., Ltd., Japan, weight average molecular weight of 7,500) in methyl ethyl ketone with 50 g, instead of 45 g, of the acrylate resin of Formula 1 having a weight average molecular weight of 2,500.

Comparative Example 2

An ACF composition was prepared according to the method of Example 1, with the exception of using 80 g of a phenoxy resin (E1256, Japan Epoxy Resin, Japan, weight average molecular weight of 59,400) dissolved in methyl ethyl ketone to a solid content of 39% instead of the CAB copolymer of Example 1.

Comparative Example 3

An ACF composition was prepared according to the method of Example 1, with the exception of using 80 g of a phenoxy resin (E4275, Japan Epoxy Resin, Japan, weight average molecular weight of 73,800) dissolved in methyl ethyl ketone to a solid content of 40% instead of the CAB copolymer of Example 1.

Comparative Example 4

An ACF composition was prepared according to the method of Example 1, with the exception of using 80 g of an acryl rubber (SG708-6, Nagase Chemtex, Japan, weight average molecular weight of 700,000) dissolved in methyl ethyl ketone to a solid content of 19% instead of the CAB copolymer of Example 1.

Comparative Example 5

An ACF composition was prepared according to the method of Example 1, with the exception of using 80 g of an acryl rubber (SGP3, Nagase Chemtex, Japan, weight average molecular weight of 850,000) dissolved in methyl ethyl ketone to a solid content of 14% instead of the CAB copolymer of Example 1.

Comparative Example 6

An ACF composition was prepared according to the method of Example 1, with the exception of using 100 g of a urethane acrylate resin (UX-3204, Nippon Kayaku, Japan, weight average molecular weight of 11,500) instead of the 75 g of bisphenol A type epoxy acrylate resin and the acrylate of Formula 1.

Each of the respective ACF compositions of Examples 1-4 and Comparative Examples 1-6 was applied onto a silicone treated polyester film with a casting knife.

Each ACF composition was dried for 5 minutes at 80° C. to evaporate the solvent to form an ACF having a thickness of about 30 µm to 50 µm. The ACF was slit to a width of 1.5 mm and evaluated to determined film properties, i.e., composition uniformity, dispersion of conductive particles, precipitation of conductive particles, coating, yield stress, and breaking strain. Next, adhesion and contact resistance were tested in each ACF. Grading was as follows: 5, 4=good; 3=moderate; 2, 1=poor.

Evaluation of ACF Composition: prior to formation of each ACF of Examples 1-4 and Comparative Examples 1-6, a sample of each ACF composition was set to stand for about 6 hours. Each sample was evaluated, i.e., evaluation of color uniformity via naked-eye to determine particle sedimentation, for composition uniformity. Each ACF composition was put in a vertically long container, followed by casting on a base film to form an ACF. A uniform ACF composition exhibited a uniform color to the naked eye. A non-uniform ACF composition exhibited non-uniform color, i.e., conductive particles' density in a base part of the container was different as compared to a top part of the container.

Evaluation of yield stress: each of ACFs of Examples 1-4 and Comparative Examples 1-6 was peeled off its respective polyester film with a universal testing machine (UTM, model H5KT). After peeling off, tensile test was carried out by stretching an ACF sample with the UTM at a speed of 50 mm/min. The stretching continued until the ACF broke. Each ACF sample had a length of 10 mm, width of 1 mm, and thickness of 35 µm.

Evaluation of strain: The breaking strain was calculated using the stretched length of each ACF at a point corresponding to 50% of the yield stress, where the breaking is retarded due to the rubber property. Breaking strain was calculated according to equation 1 below, where $L_0$ is an initial length, i.e., 10 mm, and L is a stretched length. Results are reported in Table 1 below.

$$\text{Breaking Strain}(\%) = \frac{L - L_0}{L_0} \times 100$$

TABLE 1

Evaluation of ACF compositions and ACFs

| | Uniformity of Compositions | Dispersion of particles | Precipitation of particles | Coating Property | Yield Stress (gf/mm²) | Breaking Strain (%) |
|---|---|---|---|---|---|---|
| Example 1 | 5 | 5 | 5 | 5 | 30 | 1100 |
| Example 2 | 5 | 5 | 5 | 5 | 35 | 950 |
| Example 3 | 3 | 3 | 5 | 3 | 67 | 800 |
| Example 4 | 4 | 3 | 5 | 3 | 25 | 1100 |
| Comparative Example 1 | 4 | 4 | 1 | 1 | ND | ND |
| Comparative Example 2 | 5 | 4 | 2 | 3 | 244 | 110 |
| Comparative Example 3 | 5 | 4 | 2 | 3 | 141 | 200 |
| Comparative Example 4 | 1 | 2 | 3 | 2 | 56 | 950 |
| Comparative Example 5 | 1 | 2 | 3 | 2 | 44 | 300 |
| Comparative Example 6 | 4 | 5 | 5 | 3 | 36 | 1000 |

\* Sensory test: 5 (good) to 1 (poor);
ND = not determined.

As can be seen from Table 1 above, the ACF compositions of Examples 1-4 exhibited good uniformity of composition, good dispersion of conductive particle, and substantially no precipitation of particles, thereby providing superior insulation and reliable conductive anisotropy. An ACF composition exhibiting such properties may be applied as coating for a long duration, while maintaining uniformity and cohesion, thereby exhibiting substantially minimized pinholes and/or scratches in the resultant ACF, which in turn may increase productivity and production yield.

In contrast, the ACF of Comparative Example 1, i.e., no thermoplastic resin, exhibited excessive precipitation of particles, thereby triggering an excessive pinhole formation and non-uniform coating. As such, the ACF of Comparative Example 1 exhibited very low strength, i.e., too low to ensure operability during slitting, thereby failing to provide adhesion and contact resistance reliability.

The ACFs of Comparative Examples 2-3, i.e., thermoplastic resins having low weight average molecular weights below about 150,000, exhibited reduced film uniformity due to fast particle precipitation, i.e., minimized possibility of film coating over a span of 300 m or more. Further, the resultant ACFs had a low strength, i.e., breaking strain of less than 300%, and a low tack.

In Comparative Examples 4 and 5, use of thermoplastic resins having high weight average molecular weights, i.e., above about 600,000, caused non-uniform compositions due to poor compatibility and non-uniform dispersion of particles.

Evaluation of adhesion and contact resistance: each of the ACFs of Examples 1-4 and Comparative Examples 1-6, i.e., a sample having a width of 1.5 mm and thickness of 35 μm, was used to electrically connect a chip on film (COF) to a printed circuit board (PCB, pitch 410 μm). Each of the electrical connection was made by applying pressure of 1 MPa for 1 second at 80° C. to provide initial bonding, followed by applying pressure of 3 MPa for additional 5 seconds at 180° C. to strengthen the initial bonding. Next, the ACFs were set at room temperature for 1 hour. Initial adhesion and contact resistance of each ACF were tested under room temperature and humidity conditions by performing 90° peel strength test and a 2-probe method using silver paste short, respectively. Adhesion and contact resistance were tested again by the same methods under high temperature and humidity conditions, i.e., after samples were left at 85° C. and R.H. 85% for a duration of 250 hours and 500 hours. Result are reported Table 2 below.

TABLE 2

Evaluation of adhesion and contact resistance of ACFs

| | Adhesion | Contact Resistance (Ω) | | |
|---|---|---|---|---|
| | (gf/cm) | Initial | 250 hours | 500 hours |
| Example 1 | 804 | 1.13 | 1.18 | 1.24 |
| Example 2 | 612 | 0.98 | 1.01 | 1.31 |
| Example 3 | 517 | 1.11 | 1.28 | 1.51 |
| Example 4 | 559 | 1.34 | 1.42 | 1.58 |
| Comparative Example 1 | 196 | 1.18 | 1.84 | 4.12 |
| Comparative Example 2 | 988 | 1.41 | 1.64 | 1.86 |
| Comparative Example 3 | 813 | 1.26 | 1.58 | 1.73 |
| Comparative Example 4 | 336 | 1.67 | 2.94 | 4.88 |
| Comparative Example 5 | 304 | 2.87 | 3.74 | 12.25 |
| Comparative Example 6 | 612 | 1.81 | 2.12 | 5.21 |

As seen in Table 2 above, the ACFs of Examples 1-4 exhibited a stable adhesion strength of at least 500 gf/cm with a short bonding process (180° C., 5 seconds, 3.0 MPa), an initial contact resistance of 2.5Ω or less, and a contact resistance of 4.0Ω or less under high temperature/humidity conditions. As such, the ACFs of Examples 1-4 may provide superior circuit connectivity and reliability, e.g., when driving a display devices. In contrast, Comparative Examples 4-5, for example, exhibited low adhesion and contact reliability because of excessive contraction and expansion inside the connected structure. In Comparative Example 6, an ACF having a thermosetting material with molecular weight higher than about 10,000, contact resistance was increased under hot and humid conditions.

ACF composition according to embodiments of the present invention may be advantageous in providing superior productivity with regard to coating and slitting during film formation. Further, ACFs prepared from the ACF compositions may exhibit excellent cutting property, pre-bonding property, and pre-bonding reworkability, thereby improving module productivity in the module manufacturing line. As such, the ACFs may have good reworkability after curing. In addition, the ACFs of the present invention may form a densely cured structure during circuit connection process, thereby exhibiting superior long-term reliability and stable adhesion. Also, good module productivity may be attained since the circuit connection can be completed in short time by heating and pressing.

Exemplary embodiments of the present invention have been disclosed herein, and although specific terms are employed, they are used and are to be interpreted in a generic and descriptive sense only and not for purpose of limitation. Accordingly, it will be understood by those skilled in the art that various changes in forms and details may be made without departing from the spirit and scope of the present invention as set forth in the following claims.

What is claimed is:

1. An anisotropic conductive film (ACF) composition, comprising:
   a thermoplastic resin having a weight average molecular weight of about 150,000 to about 600,000;
   a thermosetting curing agent having a weight average molecular weight of about 100 to about 10,000, the thermosetting curing agent including an acrylate functional group and/or a methacrylate functional group, the thermosetting curing agent being present in the ACF composition in an amount of about 100 parts by weight to about 400 parts by weight with respect to 100 parts by weight of the thermoplastic resin;
   an organic peroxide;
   a silane coupling agent; and
   conductive particles.

2. The ACF composition as claimed in claim 1, wherein the organic peroxide is present in the ACF composition in an amount of about 0.3 parts by weight to about 10 parts by weight with respect to 100 parts by weight of the thermosetting curing agent.

3. The ACF composition as claimed in claim 2, wherein:
   the silane coupling agent is present in the ACF composition in an amount of about 0.2 parts by weight to about 10 parts by weight with respect to 100 parts by weight of a combined amount of the thermoplastic resin, the thermosetting curing agent, and the organic peroxide, and
   the conductive particles are present in the ACF composition in an amount of about 0.2 parts by weight to about 30 parts by weight with respect to 100 parts by weight of a combined amount of the thermoplastic resin, the thermosetting curing agent, the organic peroxide, and the silane coupling agent.

4. The ACF composition as claimed in claim 1, wherein the thermoplastic resin includes one or more of an olefin resin, an acryl rubber, a butadiene resin, an acrylonitrile butadiene copolymer, a carboxylated acrylonitrile butadiene copolymer, a polyvinyl butyral resin, a phenoxy resin and/or an epoxy resin.

5. The ACF composition as claimed in claim 4, wherein the thermosetting curing agent includes one or more of methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(arcyloxypolymethoxy)phenyl]propane, 2,2-bis[4-(arcyloxypolyethoxy)phenyl]propane, dicyclopentenylacrylate, tricyclodecanylacrylate, tris(acryloyloxyethyl)isocyanorate, 2-methacryloyloxyethyl acid phosphate, and/or 2-acryloyloxyethyl phosphate.

6. The ACF composition as claimed in claim 5, wherein the organic peroxide includes one or more of a diacyl peroxide, a peroxydicarbonate, a peroxyester, a peroxyketal, and/or a dialkyl peroxide.

7. The ACF composition as claimed in claim 6, wherein the silane coupling agent includes one or more of a vinyl group, an epoxy group, a methacryloxy group, an acryloxy group, an amino group, a ureido group, a chloropropyl group, a mercapto group, a sulfido group, and/or an isocyanate group.

8. The ACF composition as claimed in claim 7, wherein the conductive particles include metal particles, crystalline carbon particles, amorphous carbon particles, metal coated polymeric particles, and/or insulation coated conductive particles.

9. The ACF composition as claimed in claim 1, further comprising one or more of a polymerization inhibitor, an antioxidant, and/or a heat stabilizer.

10. The ACF composition as claimed in claim 1, wherein the thermosetting curing agent includes a compound represented by Formula 1:

12. The ACF as claimed in claim 11, wherein the ACF exhibits a yield stress of about 20 gf/mm$^2$ or more and a breaking strain of about 300% or more.

13. The ACF as claimed in claim 11, wherein the organic peroxide is present in the film composition in an amount of about 0.3 parts by weight to about 10 parts by weight with respect to 100 parts by weight of the thermosetting curing agent.

14. The ACF as claimed in claim 13, wherein:
the silane coupling agent is present in the film composition in an amount of about 0.2 parts by weight to about 10 parts by weight with respect to 100 parts by weight of a combined amount of the thermoplastic resin, the thermosetting curing agent, and the organic peroxide; and
the conductive particles are present in the film composition in an amount of about 0.2 parts by weight to about 30 parts by weight with respect to 100 parts by weight of a combined amount of the thermoplastic resin, the thermosetting curing agent, the organic peroxide, and the silane coupling agent.

15. The ACF as claimed in claim 11, wherein the thermoplastic resin includes one or more of an olefin resin, an acryl rubber, a butadiene resin, an acrylonitrile butadiene copolymer, a carboxylated acrylonitrile butadiene copolymer, a polyvinyl butyral resin, a phenoxy resin and/or an epoxy resin.

16. The ACF as claimed in claim 15, wherein the thermosetting curing agent includes one or more of methyl acrylate, ethyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(arcyloxypolymethoxy)phenyl]propane, 2,2-bis[4-(arcyloxypolyethoxy)phenyl]propane, dicyclopentenylacrylate, tricyclodecany-

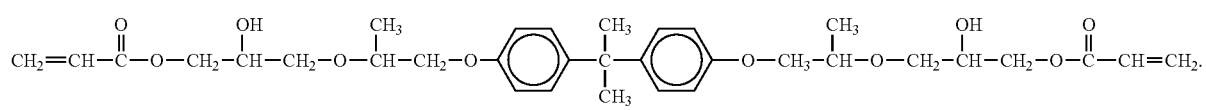

lacrylate, tris(acryloyloxyethyl)isocyanorate, 2-methacryloyloxyethyl acid phosphate, and/or 2-acryloyloxyethyl phosphate.

17. The ACF as claimed in claim 16, wherein the organic peroxide includes one or more of a diacyl peroxide, a peroxydicarbonate, a peroxyester, a peroxyketal, and/or a dialkyl peroxide.

18. The ACF as claimed in claim 17, wherein the silane coupling agent includes one or more of a vinyl group, an epoxy group, a methacryloxy group, an acryloxy group, an amino group, a ureido group, a chloropropyl group, a mercapto group, a sulfido group, and/or an isocyanate group.

19. The ACF as claimed in claim 11, wherein the additive includes one or more of a polymerization inhibitor, an antioxidant, and/or a heat stabilizer.

20. The ACF as claimed in claim 11, wherein the thermosetting curing agent includes a compound represented by Formula 1:

11. An anisotropic conductive film (ACF), comprising:
a release layer; and
a film composition on the release layer, the composition including:
a thermoplastic resin having a weight average molecular weight of about 150,000 to about 600,000,
a thermosetting curing agent having a weight average molecular weight of about 100 to about 10,000, the thermosetting curing agent including an acrylate functional group or a methacrylate functional group, the thermosetting curing agent being present in the ACF composition in an amount of about 100 parts by weight to about 400 parts by weight with respect to 100 parts by weight of the thermoplastic resin,
an organic peroxide,
a silane coupling agent, and
conductive particles.

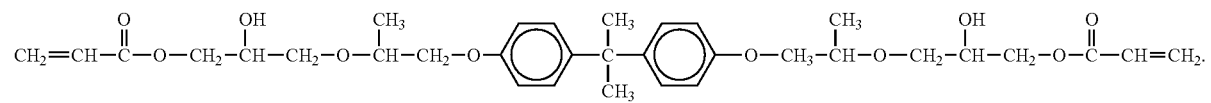
(1)
* * * * *